(12) United States Patent
Mason

(10) Patent No.: US 6,393,547 B1
(45) Date of Patent: May 21, 2002

(54) CIRCUIT FOR TIME-SHARING OF CONFIGURABLE I/O PINS

(75) Inventor: Robert Charles Mason, Raleigh, NC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/152,879

(22) Filed: Sep. 14, 1998

(51) Int. Cl.[7] ................................................. G06F 3/00
(52) U.S. Cl. ............................................. 712/39; 710/8
(58) Field of Search ................................ 716/2; 712/39, 712/209; 710/2, 8; 327/19, 112; 326/39, 38

(56) References Cited

U.S. PATENT DOCUMENTS

| | | | | |
|---|---|---|---|---|
| 5,539,338 A | * | 7/1996 | Moreland | 327/19 |
| 5,787,299 A | * | 7/1998 | Ostler et al. | 712/39 |
| 5,930,149 A | * | 7/1999 | Takahashi | 716/2 |
| 6,038,615 A | * | 3/2000 | Yamada et al. | 710/2 |

* cited by examiner

Primary Examiner—Zarni Maung
Assistant Examiner—Jungwon Chang
(74) Attorney, Agent, or Firm—David R. Stacey; Larry T. Shrout; Larry I. Golden

(57) ABSTRACT

A circuit for efficiently time-sharing the output and input configuration of a microprocessor I/O pin. The circuit includes a microprocessor having at least one I/O pin which can be selectively reconfigured for either output or input functions, a pull-up resistor, a dropping resistor and an output device. The pull-up resistor, dropping resistor and output device each have a common electrical connection at a terminal connected to the selected I/O pin. The pull-up resistor also has a terminal connected to the regulated power supply (Vcc) of the circuit. An input device or configuration switch, which is selectable between a first state and a second state, has one terminal connected to the dropping resistor and a second terminal connected to a point of the circuit at ground potential. The selected I/O pin is normally configured as an output pin for controlling the output device. At one or more intervals, as determined by a software program, the selected I/O pin will be reconfigured for input and will read the status of the input device. The input device will have provide a logical condition "1" or a logical condition "0" input status to the selected I/O pin depending on its selectable state of open or closed. The logical "1" or "0" is represented by a voltage level. The interval at which the selected I/O pin will be reconfigured for input is determined by both the type of output device being controlled and the type of input represented by the input device. The pull-up and dropping resistors have a resistance value ratio of 10:1 or greater. The actual resistance values are selected such that the output signal from the selected I/O pin can override the representative voltage levels of the logical conditions "1" or "0" of the input device when the selected I/O pin is configured for output.

13 Claims, 3 Drawing Sheets

US 6,393,547 B1

CIRCUIT FOR TIME-SHARING OF CONFIGURABLE I/O PINS

FIELD OF THE INVENTION

The present invention relates to microprocessors and in particular to a method of time-sharing a microprocessor's configurable I/O pins.

BACKGROUND OF THE INVENTION

Microprocessors are provided with a number of terminal pins, some of which provide power to the microprocessor while others allow the microprocessor to communicate with other devices by receiving signals on input pins or sending signals on output pins. In a typical microprocessor, some pins are dedicated to particular input or output functions, while others can be selectively configured to perform either input or output functions. In either case, each I/O pin is associated with only one input or output device. With the complexity of electronic circuits today, it is not uncommon for an application to require more input and/or output pins than the microprocessor has available. One solution is to add additional interface adapters thereby increasing the number of available I/O pins. This solution adds additional components to the circuit, which, in turn, requires more space on the printed circuit board and increases cost. Another solution is to share configurable I/O pins by putting one input and one output device on a selected pin. This type of reconfiguration has required the disabling of both internal and external circuitry connected to the selected pin in one direction (input or output) while the other direction (output or input) is active. To accomplish this, two signals must be executed by the microprocessor. One signal disables the internal circuitry of the selected pin and one signal disables the external circuitry of the selected pin. This also requires the use of at least two microprocessor pins. One is the input pin that reads the status of the input device and the other is the pin through which the signal disabling the external circuit is sent. An example of this type of pin sharing is provided in the Microchip Technology, Inc., application note AN529, dated 1994, incorporated herein by reference, which describes a multiplexing LED drive and a 4×4 keypad sampling. The particular application described by Microchip is well suited for multiplexing a number of input and output signals; however, it is not efficient for industrial control applications. FIG. 1 illustrates a simplified circuit diagram of the Microchip's circuit 2A as it might be applied to industrial control applications. This circuit requires two output pins and one input pin to provide a pulsed output to one segment of the four 7-segment LED's and to read the status of one of the 4×4 keypad switches. This method of pin reconfiguration, although allowing more I/O functions for the number of I/O pins, is not the most efficient use of microprocessor I/O pins when used in other applications. Further, this circuit can not be used for I/O pin time-sharing when the output device requires a continuous control signal from the microprocessor. It would therefore be desirable to provide a circuit and method of pin reconfiguration that involves only the I/O pin that has been selected for reconfiguration. Such a method of reconfiguration would permit the I/O pin previously required for sending the external circuitry disable signal to be selectively reconfigured also. It would further be desirable that a single time-sharing circuit configuration be usable for output devices requiring a continuous signal from the output pin of the microprocessor and for output devices operable from a pulsed or periodically interrupted output signal.

SUMMARY OF THE INVENTION

The present invention provides a circuit for efficiently reconfiguring a microprocessor I/O pin for time-sharing between an input function and an output function. This circuit does not require the disabling of external circuitry or the use of additional microprocessor pins to accomplish the output-to-input reconfiguration and can be used with output devices requiring either a continuous or intermittent output signal. In this circuit, a pull-up resistor, a dropping resistor and an output device all have a common electrical connection at a terminal connected to the selected reconfigurable I/O pin of the microprocessor. The selected reconfigurable I/O pin of the microprocessor is normally configured as an output pin for controlling the output device. The other terminal of the pull-up resistor is connected to the regulated power source (Vcc) of the circuit and the other terminal of the dropping resistor is connected to an input device. The input device provides an input signal to the microprocessor in the form of a voltage, representing a logical state of either "1" or "0", at the selected reconfigurable I/O pin. This signal is determined by the state (open or closed) of the input device, which is connected electrically between the dropping resistor and some point of the circuit at ground potential. The logical state of the input device can be observed by the microprocessor only when the selected reconfigurable I/O pin is configured for input. Therefore, the resistance values of the pull-up and dropping resistors must be selected such that a minimum resistance ratio is maintained between them. This resistance ratio permits one of two voltage levels representing the logical states of "1" or "0" to be present at the pin terminal when it is configured for input. The pull-up and dropping resistors must also have a minimum resistance value sufficiently high enough that the output signal from the selected I/O pin, when configured for output, can override the voltage value representing the logical state of the input device. This permits the I/O pin, normally configured for output, to maintain control over the associated output device regardless of the state of the input device. It is important that the type of output device connected to the selected I/O pin and the frequency of input change be considered when selecting output and input devices to share a particular I/O pin. An output device which can not tolerate periodic breaks in the output signal of the microprocessor should only share a pin with an input device providing an input signal which will not change after the initialization or start up period. Output devices which can tolerate insignificant periods of output signal loss can share an I/O pin with input devices which are expected to change logical states during normal operation. Therefore, the time or frequency at which the selected reconfigurable I/O pin can be reconfigured from output to input is dependent upon the type of output and input device selected to share the selected reconfigurable I/O pin.

Figure 1:
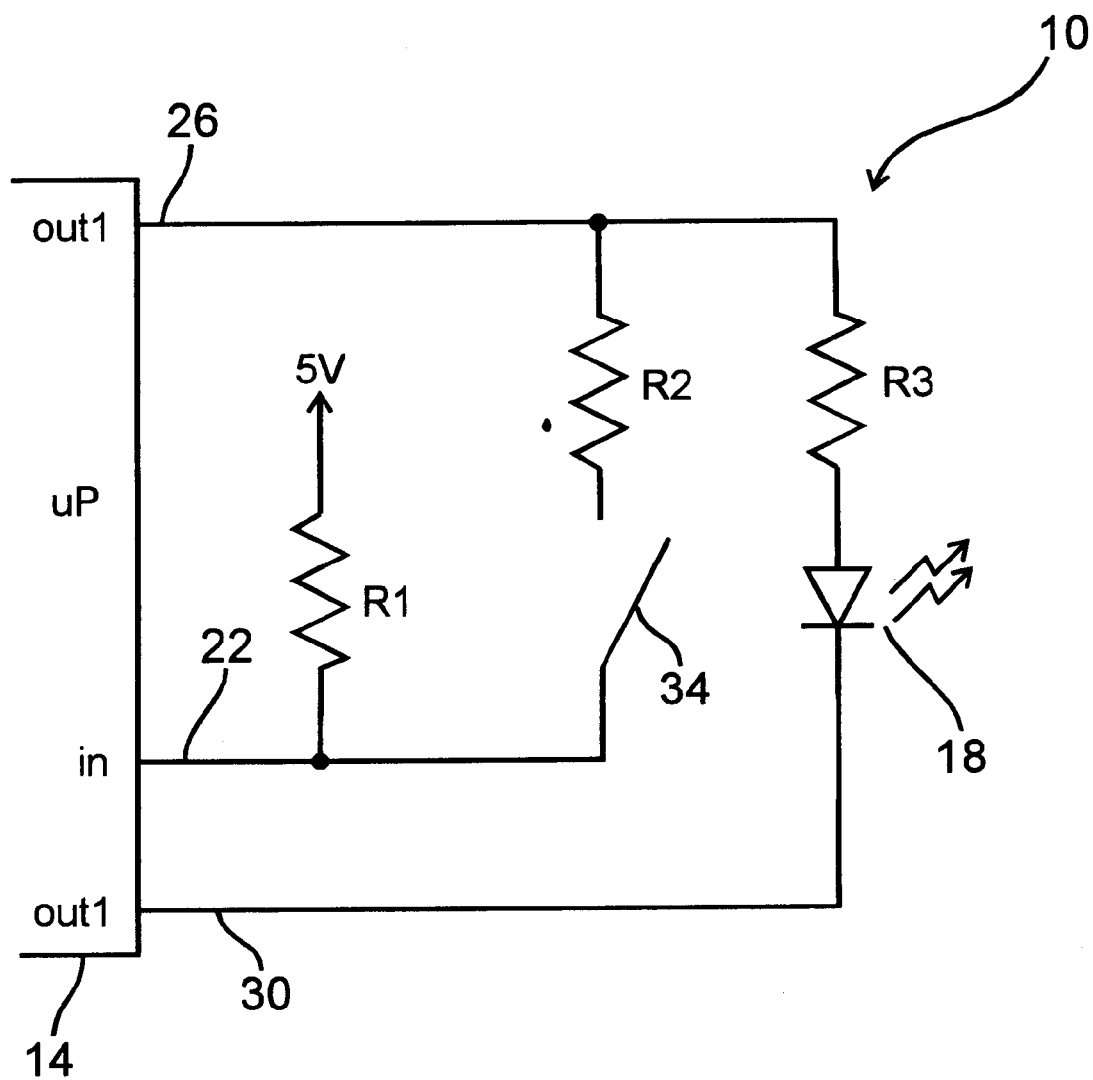
FIG. 1 is a simplified circuit diagram of the I/O pin usage and circuitry required for multiplexing outputs and inputs as disclosed in the Microchip Technology, Inc., application note AN529.

Before one embodiment of the invention is explained in detail, it is to be understood that the invention is not limited in its application to the details of construction and description or as illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

FIG. 1 illustrates a circuit, generally indicated by reference numeral 10. The circuit 10 is a greatly simplified form of the pin connections required for controlling one segment of a 7-segment LED and sampling one keypad (momentary) switch of a 4×4 keypad as disclosed in FIG. 2 of the Microchip AN529 document. In this simplified circuit 10, the microprocessor will be indicated by reference numeral 14 and one segment of the 7-segment LED will be indicated by reference numeral 18. An "in" (input) pin of the microprocessor 14, indicated by reference numeral 22, is normally held at a HIGH state due to a pull-up resistor R1 connected between the pin 22 and a 5 volt regulated power source (Vcc), indicated by 5V. Microprocessor pins "out1" indicated by reference numeral 26 and "out2" indicated by reference numeral 30, are configured as outputs. Pins 26 and 30 are normally driven HIGH by the microprocessor, thereby keeping the LED 18, connected in series with pins 26 and 30, in an OFF state. A momentary keypad switch 34 has one terminal connected to a dropping resistor R2 and another terminal connected to pin 22. The other terminal of the dropping resistor R2 is connected to pin 26. Therefore, regardless of the open or closed state of momentary switch 34, only a HIGH input status can be observed at input pin 22. For this reason, pin 26 must be pulsed to a LOW state for a very short period-of-time required for pin 22 to sample the input status of momentary switch 34. The resistance values of R1 and R2, as taught by Microchip, should have a ratio of 10:1 such that a definite HIGH or LOW value can be observed at pin 22 during the sampling of momentary switch 34. Therefore, while pin 26 is pulsed LOW, pin 22 will be observe a HIGH input (approximately 5 volts) if momentary switch 34 is open or a LOW input (approximately 0.5 volts) if momentary switch 34 is closed. The ON or OFF state of the Led 18 is controlled by microprocessor pins 26 and 30 working in conjunction with one another. When pin 30 is pulsed LOW and pin 26 is HIGH (normal state) the LED 18 will be ON. When pin 30 is pulsed LOW and pin 26 is LOW, the LED 18 will be OFF. When pin 26 is HIGH, the HIGH or LOW state of pin 26 has no effect on LED 18. Thus, the LOW pulses of pin 26 required for sampling the sate of momentary switch 34 will not effect ON or OFF state of LED 18, as it should occur while pin 30 is HIGH. In Microchip's AN529 example, an ON state of the LED 18 is accomplished by rapidly pulsing pin 30 to a LOW state with pin 26 held HIGH, which causes the LED 18 to be in a pulsed ON condition. As is common in the control of 7-segment LEDs, Microchip's application requires the pulsing of pin 30 since the output signal is multiplexed for controlling more than one LED. The pulse speed is such that the LED 18 appears to be continuously ON. The pulsing of pin 26 to a LOW state, while pin 22 samples the input status of momentary switch 34, causes the LED 18 to turn OFF. This OFF period is of an insignificant period-of-time with respect to the ON state of the LED 18 and can not be detected by the human eye. This LOW pulse period-of-time, however, is significant to the microprocessor 14, thus allowing pin 22 sufficient time to read the HIGH or LOW state of momentary switch 34. In this circuit, three microprocessor pins 22, 26 and 30, are required to control the LED 18 and read the status of momentary switch 34.

In the current state of the art, and in the circuit disclosed in Microchip's AN529, the microprocessor pins can be either dedicated input pins, dedicated output pins or selectable I/O pins, in any case, more than one pin has been required to change the input or output function of one selectable I/O pin during operation.

Figure 2:
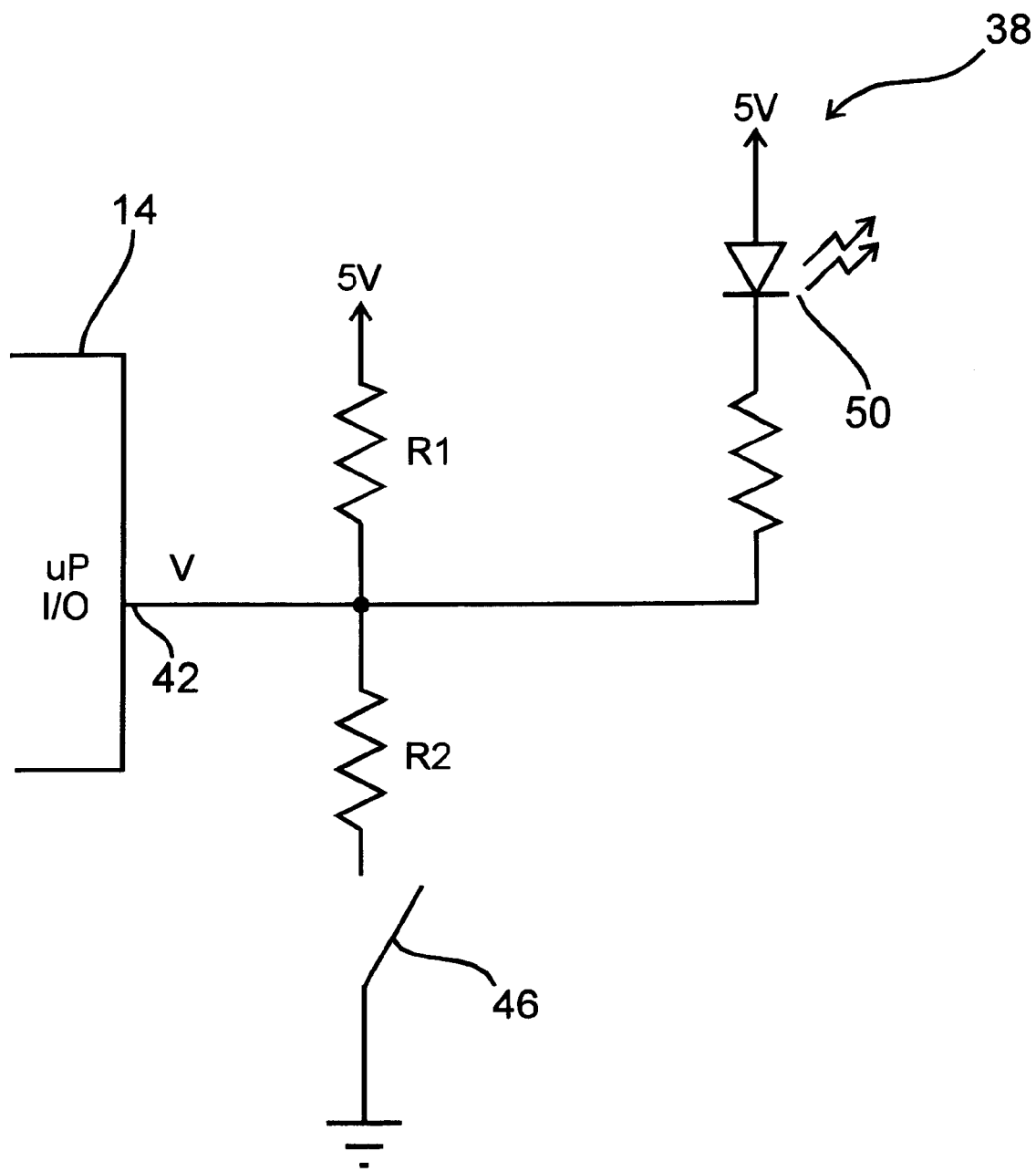
FIG. 2 is a circuit diagram for the time sharing of a single I/O pin for controlling an output device and reading the status of an input device in accordance with the present invention.

Referring now to FIG. 2, a time-sharing circuit in accordance with the present invention is illustrated and generally indicated by reference numeral 38. Electrical components common to circuit 10 will use the same reference numerals. The time-sharing circuit 38 employs only one reconfigurable I/O pin 42 of the microprocessor 14 to accomplish both output and input functions. The configuration of circuit 38 includes the pull-up resistor R1, which is connected electrically between I/O pin 42 and the regulated power supply 5V (Vcc), the dropping resistor R2 connected electrically between pin 42 and one terminal of an input device 46, the other terminal of the input device 46 being connected to ground, and a LED 50 which has one terminal connected to pin 42 and one terminal connected to the regulated power supply 5V. Pin 42 is normally configured as an output pin. The input device 46 provides an input signal at the I/O pin 42 of the microprocessor 14 in the form of a voltage, representing a logical state of either "1" or "0". This signal is determined by the state (open or closed) of the input device 46 and can be observed by the microprocessor 14 only when the I/O pin 42 is configured for input. When pin 42 is set to a HIGH state, the LED 50 will be turned OFF. When pin 42 is set to a LOW state, the LED 50 will be turned ON. When pin 42 is reconfigured as an input, the HIGH or LOW state will be determined by the OPEN or CLOSED state of the input device 46. If input device 46 is OPEN, pin 42 will observe a HIGH input status and the LED 50 will be in an OFF state. If input device 46 is CLOSED, pin 42 will observe a LOW input status and the LED 50 will be in an ON state. The resistance value ratio of approximately 10:1 for R1 and R2 (R1$\geq$10×R2) is maintained in this embodiment such that a definite HIGH or LOW value can be observed at pin 42 during the sampling of the input device 46. The values of the pull-up resistor R1 and dropping resistor R2 are also selected such that, when configured for output, the signal from pin 42 can override the LOW status value of a closed input device 46. Any leakage current in the circuit must be also considered when selecting these values. For example, values of R1=200K ohms and R2=20K ohms are practical for CMOS devices, which have negligible leakage currents. On the other hand, ALS devices, which can have leakage currents in the range of 100 microamps will require a lower resistance value for R2, such as R2=4K ohms (R1>10×R2). It is also within the scope of the invention to reverse the connections of the regulated power supply 5V and ground at the pull-up resistor R1 and the input device 46, thus causing pin 42 to be normally held LOW.

Figure 3:
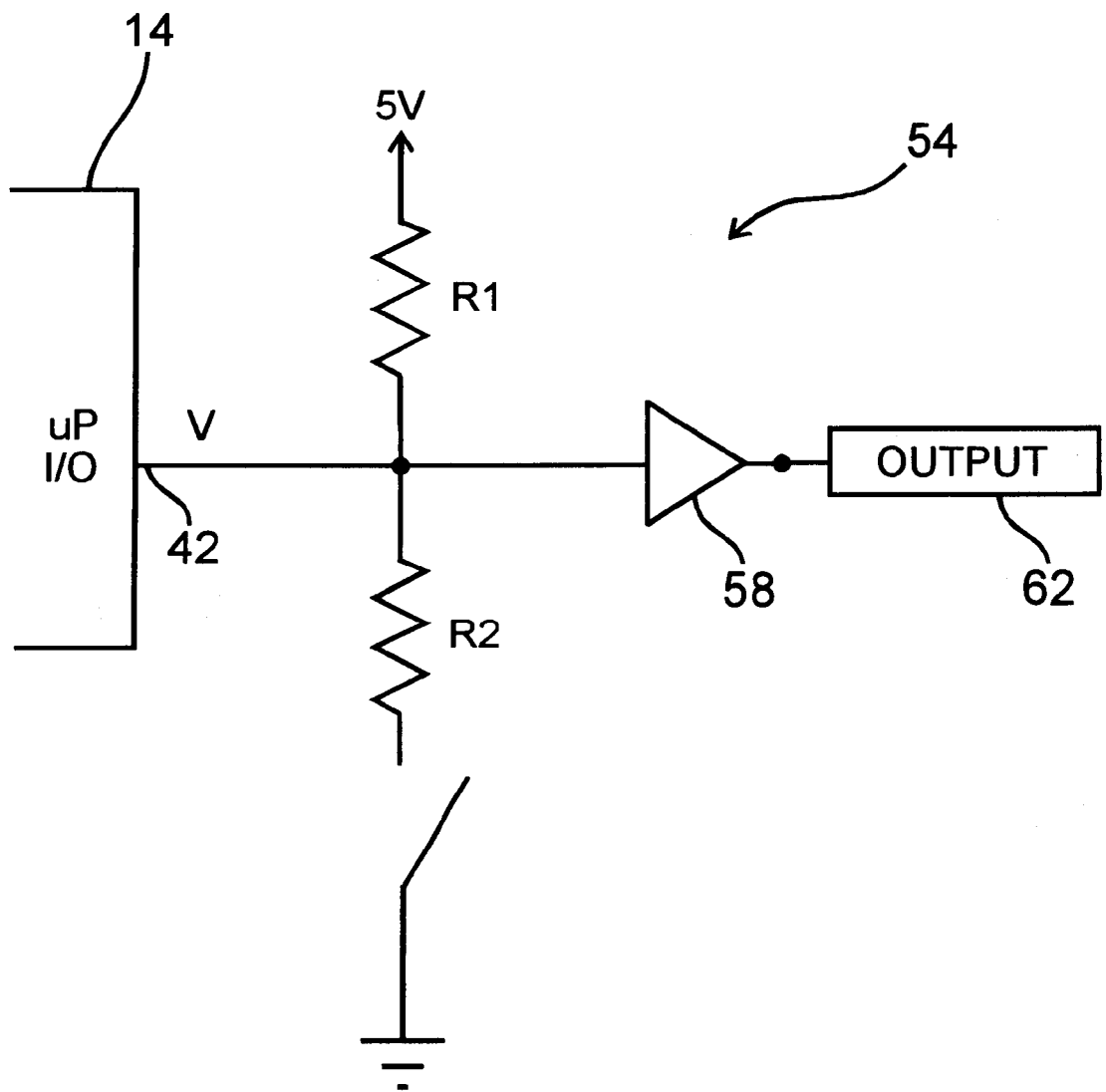
FIG. 3 is a diagram of the circuit of FIG. 2 wherein the single I/O pin controls a buffer device and reads the status of an input device in accordance with the present invention.

Referring now to FIG. 3, a circuit 54, similar to circuit 38 of FIG. 3 is shown. As in the previous Figure, components common to all circuits described herein will use the same reference numerals. In circuit 54, it can be seen that reconfigurable I/O pin 42 of the microprocessor is providing an output signal to a buffer 58, which drives an output device 62. The buffer 58, as defined in this disclosure, can be an electronic switching device such as a transistor, a relay or any similar type of interface between the microprocessor 14 and the output device 62. With the exception of the buffer 58 and output device 62 the circuit 54 and its operation is the same as circuit 38 of FIG. 2.

I claim:

1. A time-sharing circuit for a microprocessor, said circuit comprising:
   a regulated power supply;
   an output device having at least one terminal;
   a microprocessor having at least one I/O pin being selectively reconfigurable between an output function and an input function, said at least one I/O pin normally configured for said output function and being connected to said at least one terminal of said output device for providing a control signal thereto;
   a pull-up resistor connected between said regulated power supply and said at least one I/O pin;
   a dropping resistor having a first terminal connected to said at least one I/O pin and a second terminal,
   an input device connected between a circuit ground potential and said second terminal of said dropping resistor, said input device being selectable between one of two states such that an input signal determined by a selected one of said two states is provided at said at least one I/O pin of said microprocessor, and
   a software program having a step initiating a reconfiguration of said at least one I/O pin from said output function to said input function such that said input signal can be read by said at least one I/O pin, said reconfiguration beginning at a particular time determined by said software program and continuing for an insignificant period of time.

2. The circuit of claim 1 wherein said input signal is a voltage developed between said pull-up resistor and said dropping resistor.

3. The circuit of claim 2 wherein said voltage is one of two particular levels, each of said two particular levels being determined by one of said two states of said input device.

4. The circuit of claim 3 wherein one said voltage level indicates a logical condition "1" and the other said voltage level indicates a logical condition "0".

5. The circuit of claim 3 wherein the values of said pull-up resistor is equal to or greater than ten times the value of said dropping resistor such that said two particular voltage levels are sufficiently separated.

6. The circuit of claim 3 wherein the values of said dropping resistor is determined by the leakage current of the output device.

7. The circuit of claim 1 wherein said particular time for beginning reconfiguration of said at least one I/O pin can occur at any time during normal operation of said microprocessor.

8. The circuit of claim 1 wherein said input device is a jumper positioned to electrically connect two particular terminal pins of a multi pin terminal block.

9. The circuit of claim 8 wherein said input device is not user selectable after said start-up or initialization period of the microprocessor.

10. The circuit of claim 9 wherein said particular time for beginning reconfiguration of said at least one reconfigurable I/O pin is during a start-up or initialization period of said microprocessor.

11. A time-sharing circuit for a microprocessor, said circuit comprising:
    a regulated power supply;
    a microprocessor having at least one I/O pin being selectively reconfigurable between an output function and an input function;
    an output device being connected electrically to said at least one I/O pin such that a control signal from said microprocessor can be received;
    an input device being selectable between a first state and a second state and providing an input signal determined by one of said first or second states to said microprocessor, said input device having a first terminal connected to a circuit ground potential and a second terminal;
    a dropping resistor connected between said second terminal of said input device and said at least one I/O pin;
    a pull-up resistor connected between said regulated power supply and said at least one I/O pin such that a common connection of said at least one I/O pin, said pull-up resistor, said dropping resistor and said output device is formed, said pull-up resistor and said dropping resistor developing a voltage at said common connection; said voltage having a particular level depending on said first or second state of said input device such that said voltage represents said input signal; and
    a software program having a step initiating a reconfiguration of said at least one I/O pin from said output function to said input function such that said input signal can be read by said at least one I/O pin, said reconfiguration beginning at a particular time determined by said software program and continuing for an insignificant period of time.

12. A time-sharing circuit for a microprocessor, said circuit comprising:
    a microprocessor having at least one I/O pin being selectively reconfigurable between an output function and an input function;
    an output device being connected electrically to said at least one I/O pin such that a control signal from said microprocessor can be received;
    an input device providing an input signal to said microprocessor, said input device being selectable between a first state and a second state wherein one of said first or second states represents a logical condition "1" and the other of said first or second states represents a logical condition "0", said input device having a first terminal connected to a circuit ground potential and a second terminal;
    a dropping resistor having a first terminal connected to said second terminal of said input device and a second terminal connected to said at least one I/O pin and said output device thus forming a common connection;
    a pull-up resistor having a first terminal connected to a regulated power supply and a second terminal connected to said second terminal of said dropping resistor at said common connection, said pull-up resistor and said dropping resistor developing a voltage at said common connection; said voltage representing said input signal; and
    a software program having a step initiating a reconfiguration of said at least one I/O pin from said output function to said input function such that said input signal can be read by said at least one I/O pin, said reconfiguration beginning at a particular time determined by said software program and continuing for an insignificant period of time.

13. A time-sharing circuit for a microprocessor, said circuit comprising:
    a microprocessor having at least one selectively reconfigurable I/O pin;
    an output device electrically connected to said at least one selectively reconfigurable I/O pin such that a control signal from said at least one selectively reconfigurable I/O pin can be received;

a input device for providing an input signal to said microprocessor, said input signal representing either a logical condition "1" or a logical condition "0", said input device being selectable between a first state and a second state, one of said first or second states representing said logical condition "1" and the other of said first or second states representing said logical condition "0", said input device having a first electrical terminal connected to a circuit ground potential and a second electrical terminal;

a dropping resistor having a first electrical terminal connected to said second electrical terminal of said input device and a second electrical terminal electrically connected between said at least one selectively reconfigurable microprocessor pin and said output device;

a pull-up resistor having a first electrical terminal electrically connected to a regulated power supply and a second electrical terminal electrically connected to said second electrical terminal of said dropping resistor and said reconfigurable I/O pin of said microprocessor, said pull-up resistor and said dropping resistor developing a voltage at said reconfigurable I/O pin, such that said input signal is present at said, said input signal being representative of a logical condition "1" or a logical condition "0" depending on said selectable state of said input device; and a software program having a step initiating a reconfiguration of said at least one reconfigurable I/O pin from an output to an input such that said logical condition can be read by said at least one reconfigurable I/O pin, said reconfiguration beginning at a particular time determined by said software program and continuing for an insignificant period of time.

\* \* \* \* \*